(12) United States Patent
Nakanishi

(10) Patent No.: US 11,115,009 B2
(45) Date of Patent: Sep. 7, 2021

(54) SEMICONDUCTOR INTEGRATED CIRCUIT

(71) Applicant: PANASONIC SEMICONDUCTOR SOLUTIONS CO., LTD., Nagaokakyo (JP)

(72) Inventor: Kazuyuki Nakanishi, Osaka (JP)

(73) Assignee: NUVOTON TECHNOLOGY CORPORATION JAPAN, Kyoto (JP)

(*) Notice: Subject to any disclaimer, the term of this patent is extended or adjusted under 35 U.S.C. 154(b) by 0 days.

(21) Appl. No.: 16/928,229

(22) Filed: Jul. 14, 2020

(65) Prior Publication Data

US 2020/0343881 A1 Oct. 29, 2020

Related U.S. Application Data

(63) Continuation of application No. PCT/JP2018/045448, filed on Dec. 11, 2018.

(30) Foreign Application Priority Data

Jan. 16, 2018 (JP) .............................. JP2018-004718

(51) Int. Cl.
*H03K 3/037* (2006.01)
*H03K 3/3562* (2006.01)
(Continued)

(52) U.S. Cl.
CPC ... *H03K 3/3562* (2013.01); *G01R 31/318541* (2013.01); *H03K 3/037* (2013.01); *H03K 19/21* (2013.01)

(58) Field of Classification Search
CPC ...... H03K 3/012; H03K 3/037; H03K 3/0372; H03K 3/353; H03K 3/356; H03K 3/3562;
(Continued)

(56) References Cited

U.S. PATENT DOCUMENTS

| 9,742,383 B2 * | 8/2017 | Maeno ............... H03K 3/35625 |
| 2003/0066001 A1 | 4/2003 | Sera et al. |

(Continued)

FOREIGN PATENT DOCUMENTS

| JP | H05-325586 A | 12/1993 |
| JP | H06-021777 A | 1/1994 |

(Continued)

OTHER PUBLICATIONS

International Search Report and Written Opinion dated Mar. 5, 2019 in International Application No. PCT/JP2018/045448; with partial English translation.

*Primary Examiner* — Long Nguyen
(74) *Attorney, Agent, or Firm* — McDermott Will and Emery LLP

(57) ABSTRACT

A semiconductor integrated circuit includes a first flip-flop that includes a first slave latch, a second flip-flop that includes a second slave latch, and a clock generation circuit that provides a common clock signal to the first flip-flop and the second flip-flop. The first slave latch includes a first inverter, a first feedback inverter that receives an output signal from the first inverter, and a first switch that is connected between an input terminal of the first inverter and an output terminal of the first feedback inverter. The first flip-flop outputs an output signal from the output terminal of the first feedback inverter.

5 Claims, 7 Drawing Sheets

(51) Int. Cl.
*G01R 31/3185* (2006.01)
*H03K 19/21* (2006.01)

(58) Field of Classification Search
CPC ............... H03K 3/35625; H03K 19/21; G01R 31/318541
See application file for complete search history.

(56) References Cited

U.S. PATENT DOCUMENTS

| | | |
|---|---|---|
| 2005/0280459 A1 | 12/2005 | Inoue |
| 2008/0218233 A1* | 9/2008 | Yamamoto ......... H03K 3/35625 327/198 |
| 2009/0002044 A1 | 1/2009 | Kobayashi |
| 2011/0254588 A1 | 10/2011 | Nacer et al. |
| 2017/0077909 A1 | 3/2017 | Maeno |
| 2017/0310309 A1 | 10/2017 | Maeno |

FOREIGN PATENT DOCUMENTS

| | | |
|---|---|---|
| JP | 2003-043108 A | 2/2003 |
| JP | 2006-005661 A | 1/2006 |
| JP | 2009-021650 A | 1/2009 |
| JP | 2014-060750 A | 4/2014 |
| JP | 2017-055332 A | 3/2017 |
| JP | 2017-096881 A | 6/2017 |

* cited by examiner ial Field

The present disclosure relates to a semiconductor integrated circuit, and particularly relates to a multi-bit flip-flop circuit.

2. Description of the Related Art

A multi-bit flip-flop is widely used in a semiconductor integrated circuit in recent years, because a multi-bit flip-flop provides advantages in reducing area and power by sharing a single clock buffer among a plurality of flip-flops and reducing the number of clock buffers as a whole.

A flip-flop is one of the most important fundamental circuits that greatly affect the chip area and the power. Thus, further reduction in area of the multi-bit flip-flop is demanded.

One of the solutions for such a demand is eliminating part of the circuit. For example, a typical multi-bit flip-flop disclosed in Japanese Unexamined Patent Application Publication No. 2017-055332 has an output circuit. In contrast, Japanese Unexamined Patent Application Publication No. 2014-060750 discloses an example of a multi-bit flip-flop in which the output circuit is eliminated. Here, an output circuit is a circuit whose output signal is not inputted to the gate of the transistor inside the flip-flop, and is outputted to only a circuit outside the flip-flop.

SUMMARY

The multi-bit flip-flop in which a conventional output circuit is eliminated has a shorter signal propagation path. Thus, when the inside potential state is unstable, the multi-bit flip-flop outputs an output signal before the waveform is sufficiently reshaped. As a result, such a multi-bit flip-flop becomes susceptible to noise, and the effect of the noise may propagate to a circuit to which the output terminal of the multi-bit flip-flop is connected.

The present disclosure has an object to provide a semiconductor integrated circuit including a multi-bit flip-flop that is less susceptible to noise and has a small area.

A semiconductor integrated circuit according to one aspect of the present disclosure includes: a first flip-flop that includes a first input circuit, a first master latch that receives an output signal from the first input circuit, and a first slave latch that receives an output signal from the first master latch; a second flip-flop that includes a second input circuit, a second master latch that receives an output signal from the second input circuit, and a second slave latch that receives an output signal from the second master latch; and a clock generation circuit that provides a common clock signal to the first flip-flop and the second flip-flop. The first slave latch includes a first inverter, a first feedback inverter that receives an output signal from the first inverter, and a first switch that is connected between an input terminal of the first inverter and an output terminal of the first feedback inverter, and the first flip-flop outputs an output signal from the output terminal of the first feedback inverter.

This achieves a semiconductor integrated circuit including a multi-bit flip-flop having a configuration without an output circuit and sufficiently including the number of stages of inverters on the signal propagation path, and also having a small area and being less susceptible to noise even when the internal potential state is unstable.

The present disclosure achieves a semiconductor integrated circuit including a multi-bit flip-flop having a small area and being less susceptible to noise.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

The embodiments according to the present disclosure are described in detail below, with reference to the drawings. Note that each of the embodiments described below shows a general or specific example. The numerical values, shapes, materials, structural elements, the arrangement and connection of the structural elements, potential states, waveforms of signals, timing of signals, etc. shown in the following embodiments are mere examples, and do not limit the scope of the present disclosure. Among the structural elements in the following embodiments, structural elements not recited in any one of the independent claims representing the broadest concepts are described as optional structural elements. Note that the figures are not necessarily precise depictions. Throughout the figures, structural elements that are essentially the same share like reference signs. Accordingly, duplicate description may be omitted or simplified.

Embodiment 1

Figure 1:
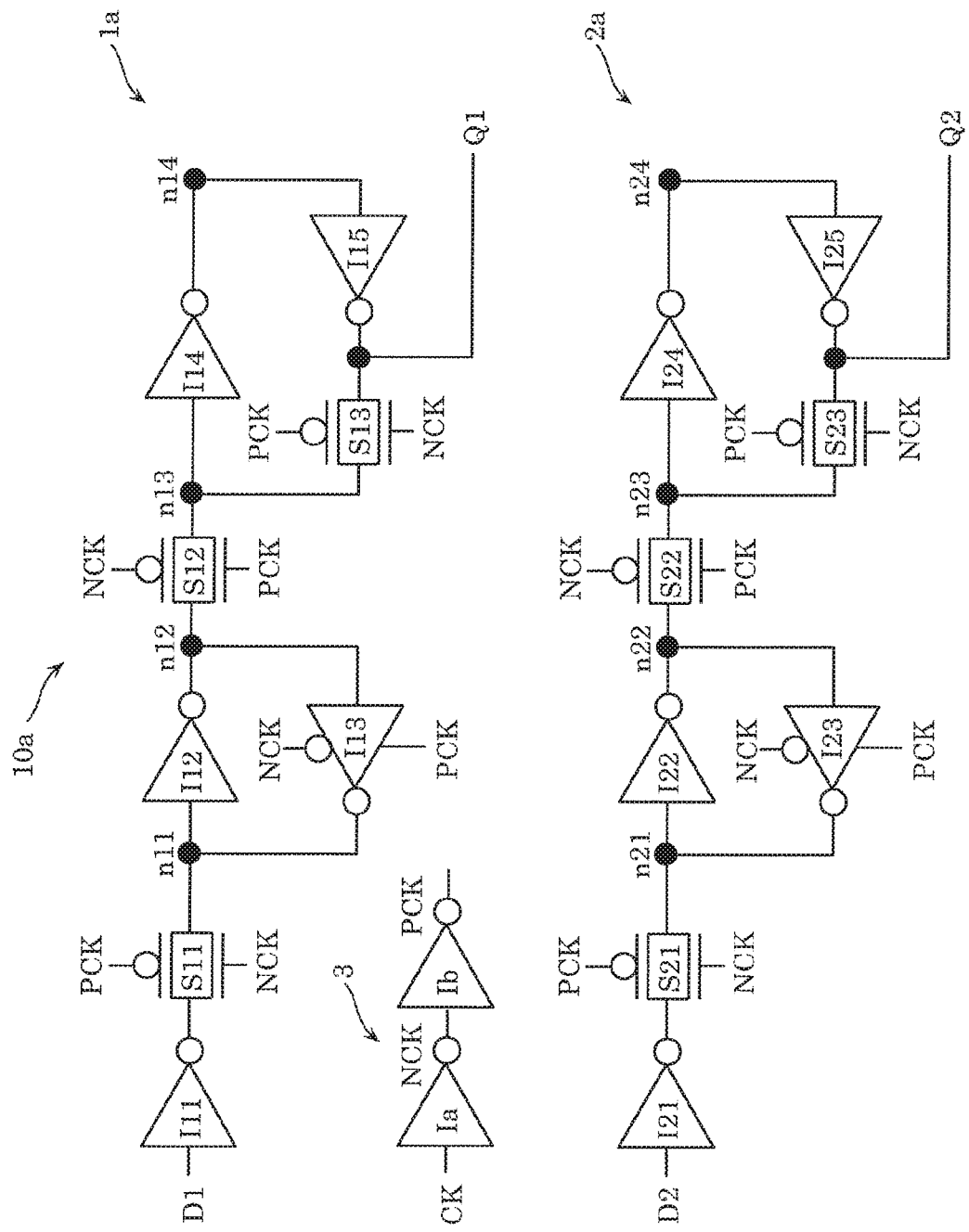
FIG. 1 is a diagram illustrating the circuit configuration of a multi-bit flip-flop included in a semiconductor integrated circuit according to Embodiment 1 of the present disclosure.

Multi-bit flip-flop 10a included in a semiconductor integrated circuit according to the present embodiment illustrated in FIG. 1 includes first flip-flop 1a, second flip-flop 2a, and clock generation circuit 3.

First flip-flop 1a includes (1) a first input circuit that includes inverter I11 that receives data D1, (2) a first master latch that includes switch S11, inverter I12, and feedback tri-state inverter I13, and receives an output signal from the first input circuit, and (3) a first slave latch that includes switch S12, first inverter I14, first feedback inverter I15, and first switch S13, and receives an output signal from the first master latch. First flip-flop 1a is a flip-flop without an output circuit and outputs its output signal Q1 from the output terminal of first feedback inverter I15.

Second flip-flop 2a includes (1) a second input circuit that includes inverter I21 that receives data D2, (2) a second master latch that includes switch S21, inverter I22, and feedback tri-state inverter I23, and receives an output signal from the second input circuit, and (3) a second slave latch that includes switch S22, second inverter I24, second feedback inverter I25, and second switch S23, and receives output signal from the second master latch. Second flip-flop 2a is a flip-flop without an output circuit and outputs its output signal Q2 from the output terminal of second feedback inverter I25.

Clock generation circuit 3 includes inverter Ia and inverter Ib. Clock generation circuit 3 receives clock CK, and outputs and provides common clock internal signals NCK and PCK to first flip-flop 1a and second flip-flop 2a. When clock CK transitions from low to high, switch S11 and switch S21 are turned off and block new input of data, and at the same time, switch S12 and switch S22 are turned on. The data signals taken into the master latches are transferred to the slave latches.

Figure 2:
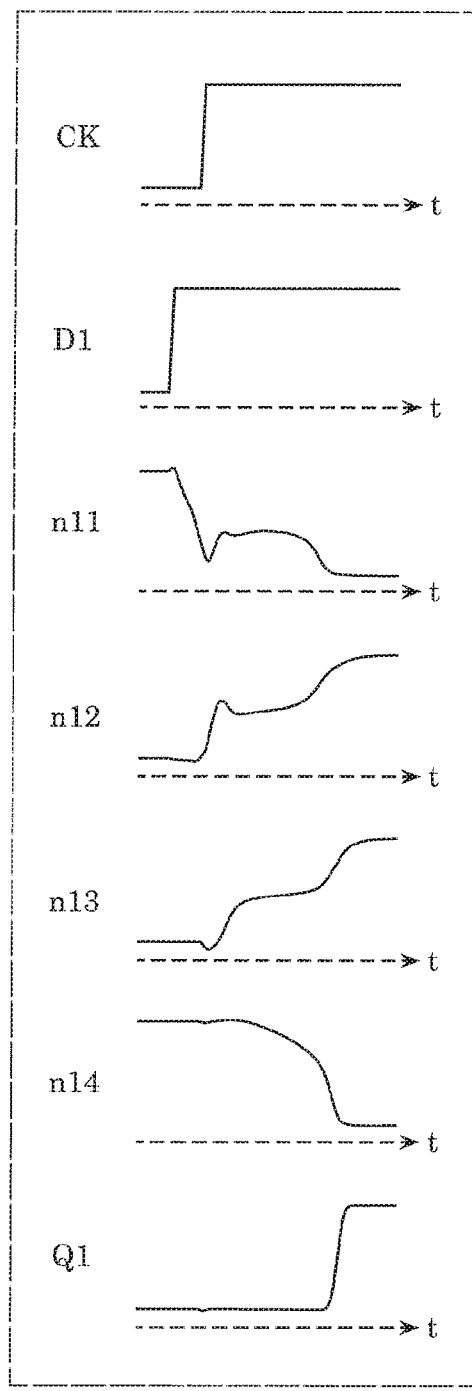
FIG. 2 is a diagram illustrating internal potential states of the multi-bit flip-flop included in the semiconductor integrated circuit according to Embodiment 1 of the present disclosure.

FIG. 2 is a diagram illustrating a potential state of each node illustrated in FIG. 1, when data D1 transitions to high immediately before clock CK transitions. While the potential of node n11 is transitioning, switch S11 is transitioning to an off state. Thus, the potentials of node n11 and node n12 transition in an unstable state, and this results in steeply sloped signal waveforms. These signal waveforms at node n11 and node n12 also affect the signal waveforms at node n13 and node n14. A conventional multi-bit flip-flop without an output circuit outputs a signal directly from node n14. Thus, such a multi-bit flip-flop is more susceptible to noise, and the effect of the noise may propagate to a circuit to which the output terminal of the multi-bit flip-flop is connected. In the present embodiment, a signal passes through at least two stages of inverters (first inverter I14 and first feedback inverter I15) when being propagated from switch S12 and outputted as output signal Q1 of first flip-flop 1a. This makes it possible to reshape each of the sloped signal waveforms to obtain a waveform as the waveform of output signal Q1.

Figure 3:
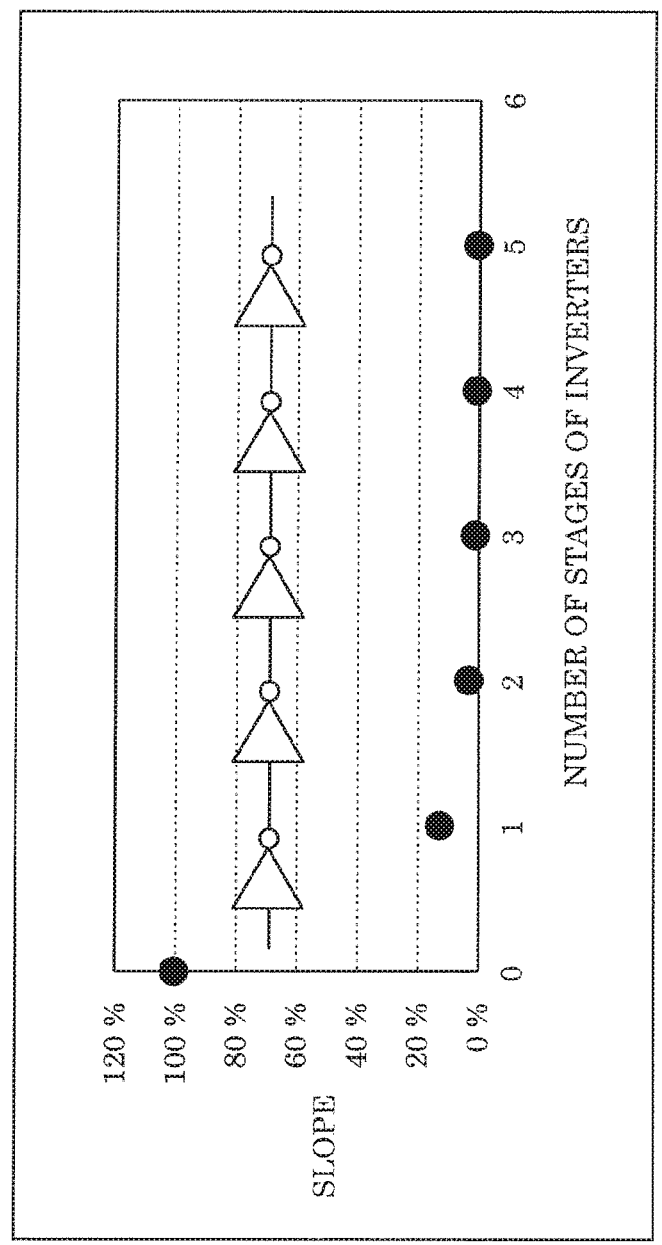
FIG. 3 is a graph showing an example of a relationship between the number of stages of inverters and a slope of a signal waveform.

FIG. 3 is a graph showing an example of a relationship between the number of stages of inverters (horizontal axis) and a slope of a signal waveform (vertical axis). Here, the "slope of a signal waveform" is a degree of inclination from a momentary potential change at the rise or fall of a signal. A larger value indicates a slower potential change. As plotted using black circles, when the slope of an input signal is assumed to be 100%, the slope of the signal after passing through one stage of inverter is approximately 10% and the effect of the slope of the input signal still remains. However, when the signal passes through two stages of inverters, the sloping of the signal is further suppressed and the effect of suppressing sloping saturates when the signal passes through more than two stages of inverters. Thus, the present embodiment makes it possible to eliminate the output circuit and ensure that the signal passes through two stages of inverters as described above. Therefore, the present embodiment enables a configuration of multi-bit flip-flop 10a having a small area and being less susceptible to noise even when the internal potential state is unstable. The explanations about FIG. 2 and FIG. 3 described above also apply to second flip-flop 2a.

As described above, multi-bit flip-flop 10a included in the semiconductor integrated circuit according to the present embodiment includes: first flip-flop 1a that includes a first input circuit, a first master latch that receives an output signal from the first input circuit, and a first slave latch that receives an output signal from the first master latch; second flip-flop 2a that includes a second input circuit, a second master latch that receives an output signal from the second input circuit, and a second slave latch that receives an output signal from the second master latch; and clock generation circuit 3 that provides a common clock signal to first flip-flop 1a and second flip-flop 2a. The first slave latch includes first inverter I14, first feedback inverter I15 that receives an output signal from first inverter I14, and first switch S13 that is connected between an input terminal of first inverter I14 and an output terminal of first feedback inverter I15, and first flip-flop 1a outputs an output signal from the output terminal of first feedback inverter I15.

This achieves a semiconductor integrated circuit without an output circuit and including multi-bit flip-flop 10a that has a small area and is less susceptible to noise even when the internal potential state is unstable, because a signal inputted to the first slave latch passes through two inverters and outputted as an output signal of first flip-flop 1a.

Embodiment 2

Figure 4:
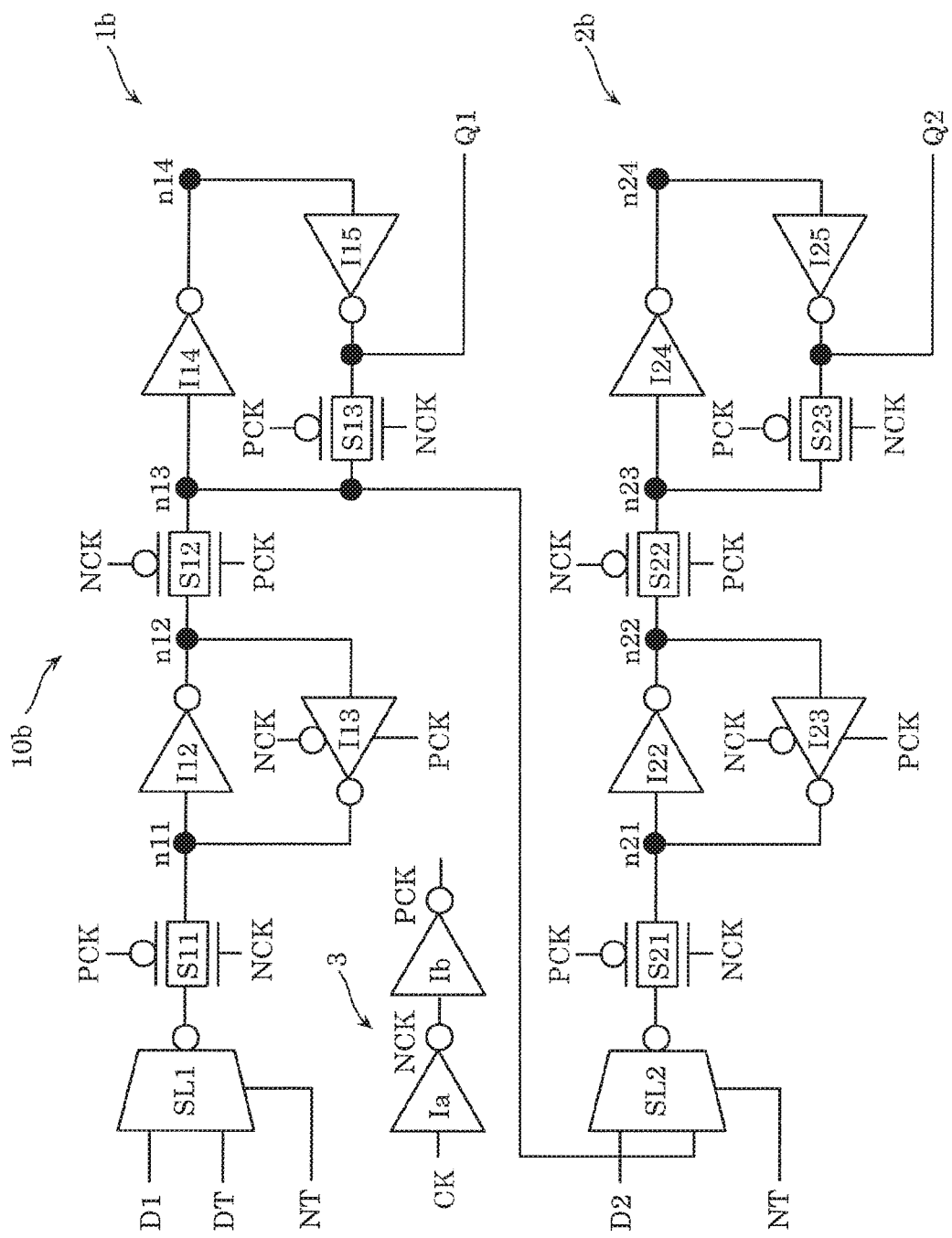
FIG. 4 is a diagram illustrating the circuit configuration of a multi-bit flip-flop included in a semiconductor integrated circuit according to Embodiment 2 of the present disclosure.

Multi-bit flip-flop 10b included in a semiconductor integrated circuit according to the present embodiment illustrated in FIG. 4 includes first flip-flop 1b, second flip-flop 2b, and clock generation circuit 3. Multi-bit flip-flop 10b has a configuration on which scan testing can be performed. First flip-flop 1b is connected in series to second flip-flop 2b for scan testing. That is to say, the first input circuit included in first flip-flop 1b is different from the first input circuit in Embodiment 1. The first input circuit includes selector SL1 that receives data D1, which is a first data input signal, scan input data DT, which is a first scan input signal, and scan enable NT which switches between data D1 and scan input data DT. The second input circuit included in second flip-flop 2b is different from the second input circuit in Embodiment 1. The second input circuit includes selector SL2 that receives data D2, which is a second data input signal, a signal from node n13 in first flip-flop 1b as a scan input, and scan enable NT which switches between data D2 and the signal from node n13. Other than the above, multi-bit flip-flop 10b has the same configuration as the configuration in Embodiment 1 illustrated in FIG. 1.

As described above, in multi-bit flip-flop 10b included in the semiconductor integrated circuit according to the present embodiment, the first input circuit receives the first data input signal and the first scan input signal, and the second input circuit receives the second data input signal and a signal to be inputted to first inverter I14. Thus, even when multi-bit flip-flop 10b has a configuration on which scan testing can be performed, multi-bit flip-flop 10b can have a configuration without an output circuit and ensure that a signal passes through two stages of inverters as described above. Therefore, this enables a configuration of multi-bit flip-flop 10b having a small area and being less susceptible to noise even when the internal potential state is unstable.

Embodiment 3

Figure 5:
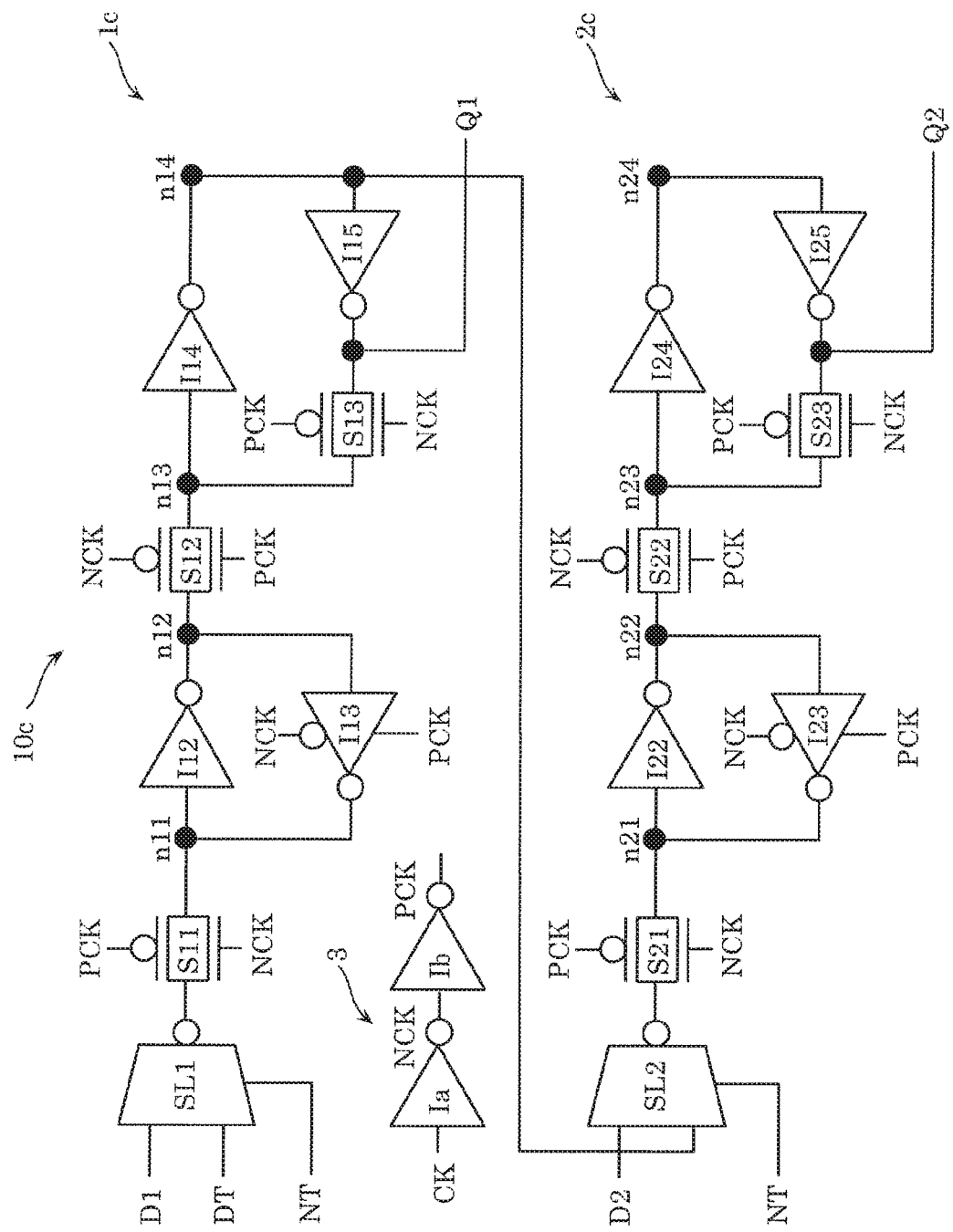
FIG. 5 is a diagram illustrating the circuit configuration of a multi-bit flip-flop included in a semiconductor integrated circuit according to Embodiment 3 of the present disclosure.

Multi-bit flip-flop 10c included in a semiconductor integrated circuit according to the present embodiment illustrated in FIG. 5 includes first flip-flop 1c, second flip-flop 2c, and clock generation circuit 3. Multi-bit flip-flop 10c also has a configuration on which scan testing can be performed as in Embodiment 2. The second input circuit included in second flip-flop 2c is different from the second input circuit in Embodiment 2, and includes selector SL2 that receives data D2 which is a second data input signal, a signal from node n14 in first flip-flop 1c as a scan input, and scan enable NT which switches between data D2 and the signal from node n14. Other than the above, the second input circuit has the same configuration as the configuration in Embodiment 2 illustrated in FIG. 4.

As described above, in multi-bit flip-flop 10c included in the semiconductor integrated circuit according to the present embodiment, the first input circuit receives a first data input signal and a first scan input signal, and the second input circuit receives the second data input signal and a signal outputted from first inverter I14.

In Embodiment 2, only selector SL2 is present on the signal propagation path from switch S12 to switch S21 of second flip-flop 2b. In contrast, the configuration of the present embodiment includes first inverter I14 and selector SL2 on the signal propagation path. Thus, it is possible to further delay the propagation of scan data. In other words, multi-bit flip-flop 10c can have a configuration having a small area and being less susceptible to noise even when the internal potential state is unstable, while achieving an advantage that second flip-flop 2c sufficiently holds a state.

Embodiment 4

Figure 6:
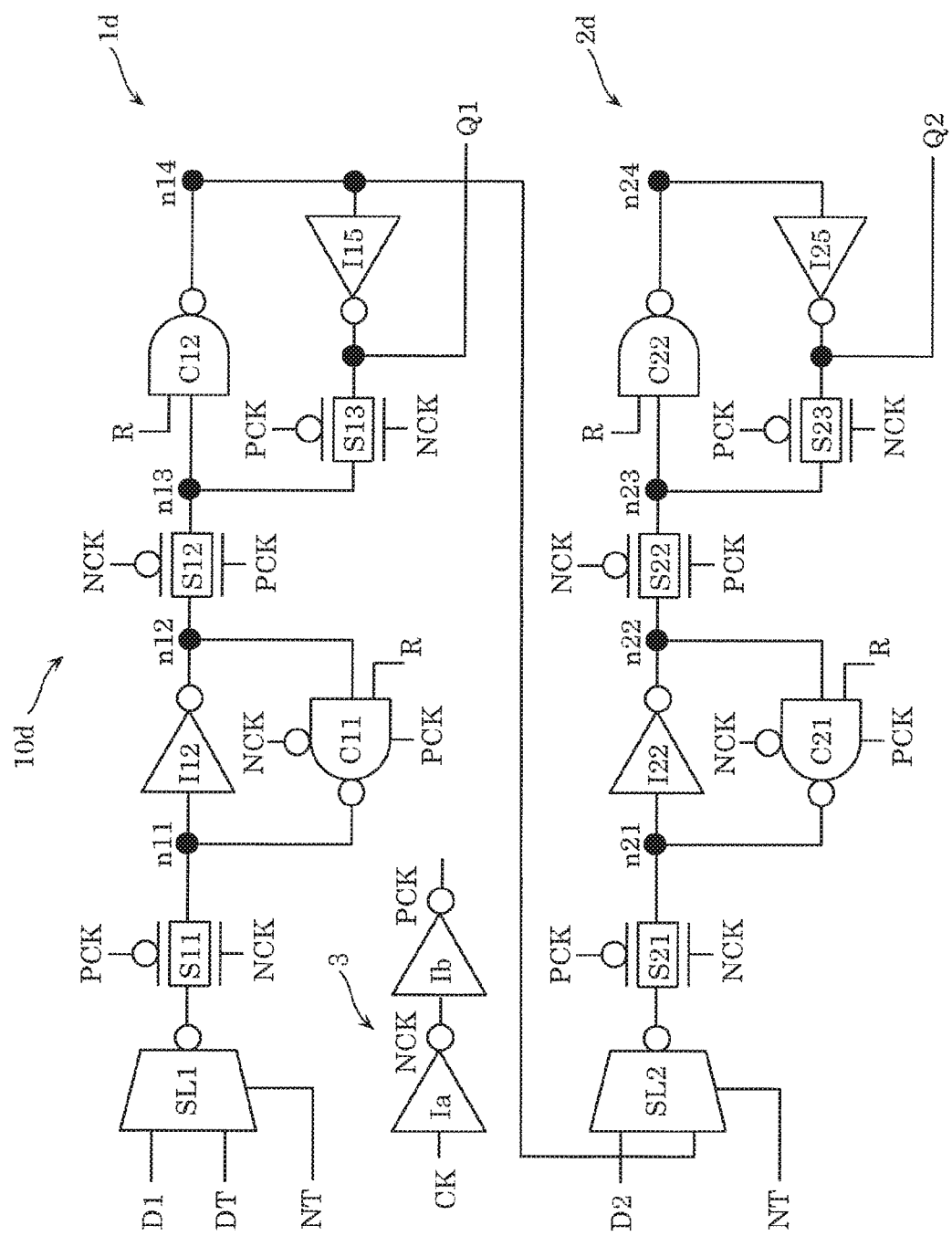
FIG. 6 is a diagram illustrating the circuit configuration of a multi-bit flip-flop included in a semiconductor integrated circuit according to Embodiment 4 of the present disclosure.

Multi-bit flip-flop 10d included in a semiconductor integrated circuit according to the present embodiment illustrated in FIG. 6 includes first flip-flop 1d, second flip-flop 2d, and clock generation circuit 3. Multi-bit flip-flop 10d has a reset function in addition to the configuration in Embodiment 3. Tri-state 2-input NAND gate C11 is used as a feedback inverter of the master latch of first flip-flop 1d, and tri-state 2-input NAND gate C21 is used as a feedback inverter of the master latch of second flip-flop 2d. Moreover, 2-input NAND gate C12 is used as an inverter of the slave latch of first flip-flop 1d, and 2-input NAND gate C22 is used as an inverter of the slave latch of second flip-flop 2d. Reset signal R is inputted to one input terminal of each of 2-input NAND gates C11, C21, C12, and C22. When reset signal R is low, output signals Q1 and Q2 will be low.

As described above, in multi-bit flip-flop 10d included in the semiconductor integrated circuit according to the present embodiment, first inverter I14 is a 2-input NAND gate that receives reset signal R through one of the input terminals. Thus, even when multi-bit flip-flop 10d has an additional reset function, multi-bit flip-flop 10d can have a configuration without an output circuit and ensure that a signal passes through two stages of inverters as described above. Therefore, this enables a configuration of multi-bit flip-flop 10d having a small area and being less susceptible to noise even when the internal potential state is unstable.

Embodiment 5

Figure 7:
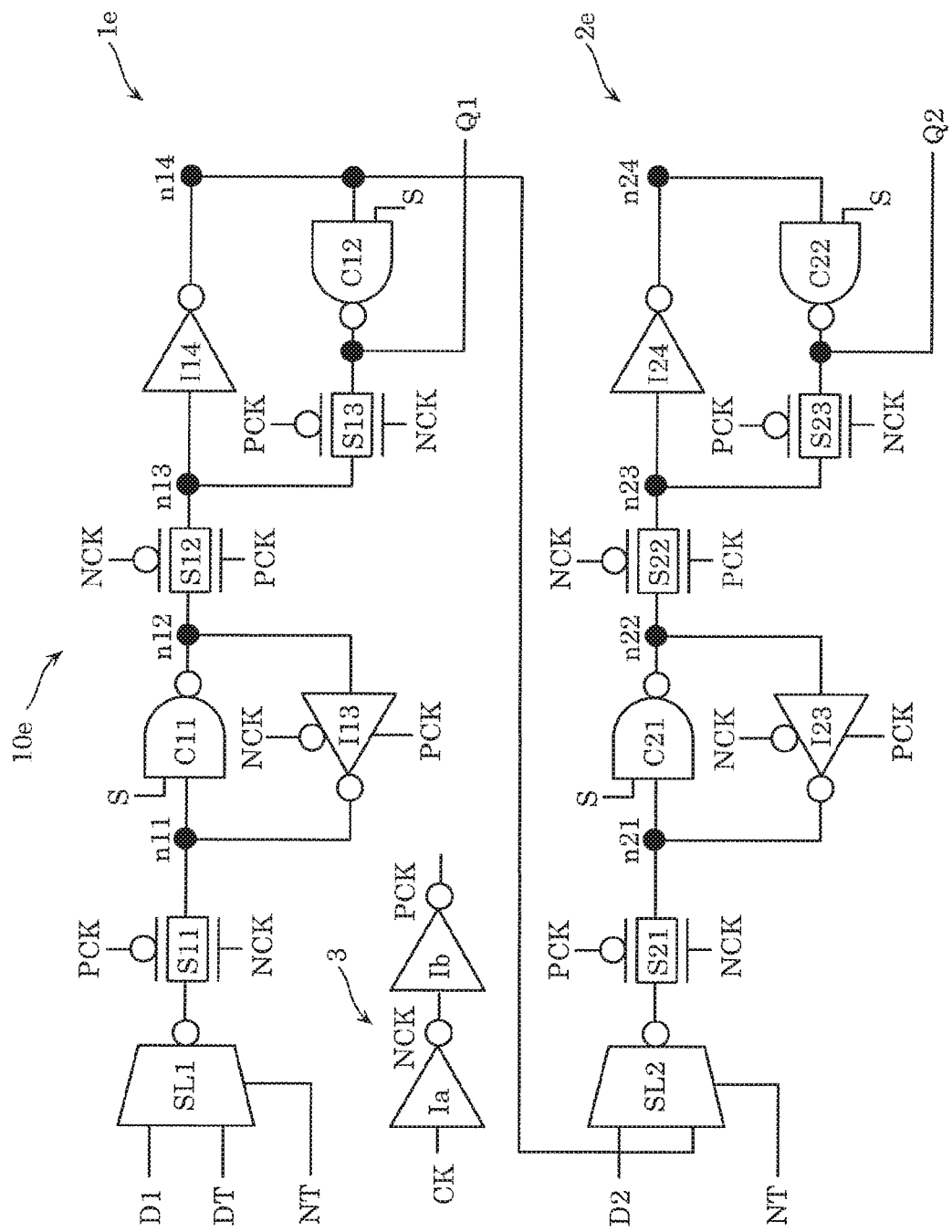
FIG. 7 is a diagram illustrating the circuit configuration of a multi-bit flip-flop included in a semiconductor integrated circuit according to Embodiment 5 of the present disclosure.

Multi-bit flip-flop 10e included in a semiconductor integrated circuit according to the present embodiment illustrated in FIG. 7 includes first flip-flop 1e, second flip-flop 2e, and clock generation circuit 3. Multi-bit flip-flop 10e has a reset function in addition to the configuration in Embodiment 3. Tri-state 2-input NAND gate C11 is used as an inverter of the master latch of first flip-flop 1e, and tri-state 2-input NAND gate C21 is used as an inverter of the master latch of second flip-flop 2e. Moreover, 2-input NAND gate C12 is used as a feedback inverter of the slave latch of first flip-flop 1e, and 2-input NAND gate C22 is used as a feedback inverter of the slave latch of second flip-flop 2e. Set signal S is inputted to one input terminal of each of 2-input NAND gates C11, C21, C12 and C22. When set signal S is low, output signals Q1 and Q2 will be high.

As described above, in multi-bit flip-flop 10e included in the semiconductor integrated circuit according to the present embodiment, first feedback inverter I15 is a 2-input NAND gate that receives set signal S through one of the input terminals. Thus, even when multi-bit flip-flop 10e has an additional set function, multi-bit flip-flop 10e can have a configuration without an output circuit and ensure that a signal passes through two stages of inverters as described above. Therefore, this enables a configuration of multi-bit flip-flop 10e having a small area and being less susceptible to noise even when the internal potential state is unstable.

Although the semiconductor integrated circuit including a multi-bit flip-flop according to the present disclosure has been described above with reference to Embodiments 1 to 5, any structural elements in these embodiments may be combined to form a new embodiment.

Instead of the inverters and the 2-input NAND gates, other circuits having a function of inverting an input signal and outputting the inverted input signal may be used as inverters, without any limitation to their specific circuit configurations.

Moreover, instead of the switches and the tri-state inverters, other circuits having a function of connecting or interrupting the input and the output using a clock internal signal may be used as switches, without any limitation to their specific circuit configurations. Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

Industrial Applicability

The semiconductor integrated circuit according to the present disclosure can suppress the effect of noise without an output circuit, and thus is applicable to a multi-bit flip-flop circuit mounted on an electronic device such as a mobile device which requires a small area and a stable operation.

What is claimed is:
1. A semiconductor integrated circuit, comprising:
a first flip-flop that includes a first input circuit, a first master latch that receives an output signal from the first input circuit, and a first slave latch that receives an output signal from the first master latch;

a second flip-flop that includes a second input circuit, a second master latch that receives an output signal from the second input circuit, and a second slave latch that receives an output signal from the second master latch; and a clock generation circuit that provides a common clock signal to the first flip-flop and the second flip-flop, wherein the first slave latch includes a first inverter, a first feedback inverter that receives an output signal from the first inverter, and a first switch that is connected between an input terminal of the first inverter and an output terminal of the first feedback inverter, and the first flip-flop outputs a data output signal from the output terminal of the first feedback inverter to an outside of the semiconductor integrated circuit.

2. The semiconductor integrated circuit according to claim 1, wherein the first input circuit receives a first data input signal and a first scan input signal, and the second input circuit receives a second data input signal and a signal outputted from the first inverter without a circuit between the second input circuit and the first inverter.

3. The semiconductor integrated circuit according to claim 1, wherein the first input circuit receives a first data input signal and a first scan input signal, and the second input circuit receives a second data input signal and a signal to be inputted to the first inverter without a circuit between the second input circuit and the first inverter.

4. The semiconductor integrated circuit according to claim 1, wherein the first inverter is a 2-input NAND gate that receives a reset signal through one of input terminals.

5. The semiconductor integrated circuit according to claim 1, wherein the first feedback inverter is a 2-input NAND gate that receives a set signal through one of input terminals.

* * * * *